(12) United States Patent
Gleason et al.

(10) Patent No.: US 6,509,138 B2
(45) Date of Patent: Jan. 21, 2003

(54) SOLVENTLESS, RESISTLESS DIRECT DIELECTRIC PATTERNING

(75) Inventors: Karen K. Gleason, Lexington, MA (US); Christopher Ober, Ithaca, NY (US); Daniel Herr, Chapel Hill, NC (US)

(73) Assignees: Semiconductor Research Corporation, Research Park, NC (US); Cornell Research Foundation, Inc., Ithaca, NY (US); Massachusetts Institute of Technology, Cambidge, MA (US)

( * ) Notice: Subject to any disclaimer, the term of this patent is extended or adjusted under 35 U.S.C. 154(b) by 0 days.

(21) Appl. No.: 09/482,193

(22) Filed: Jan. 12, 2000

(65) Prior Publication Data

US 2002/0012884 A1 Jan. 31, 2002

(51) Int. Cl.⁷ .................................................. G03F 7/26
(52) U.S. Cl. ....................... 430/313; 430/311; 430/331; 216/62
(58) Field of Search .......................... 257/426; 430/297, 430/313, 296, 311, 317, 322, 331; 216/41, 52, 62

(56) References Cited

U.S. PATENT DOCUMENTS

| | | | |
|---|---|---|---|
| 4,288,861 A | 9/1981 | Swainson et al. ............ 365/127 |
| 4,297,401 A | 10/1981 | Chern et al. ..................... 428/1 |
| 4,377,437 A | 3/1983 | Taylor et al. ................. 156/628 |
| 4,491,628 A | 1/1985 | Ito et al. ...................... 430/176 |
| 4,801,477 A | * 1/1989 | Fudim .......................... 427/510 |
| 4,944,837 A | * 7/1990 | Nishikawa ................... 156/646 |
| 4,975,347 A | * 12/1990 | Ahne et al. ..................... 438/18 |
| 5,071,730 A | 12/1991 | Allen et al. .................. 430/270 |
| 5,185,296 A | * 2/1993 | Morita ......................... 437/229 |
| 5,439,780 A | 8/1995 | Joshi et al. .................. 430/296 |
| 5,589,105 A | 12/1996 | DeSimone et al. .......... 252/351 |
| 5,593,741 A | 1/1997 | Ikeda .......................... 427/579 |
| 5,640,255 A | 6/1997 | Haines ........................... 359/2 |
| 5,643,474 A | 7/1997 | Sangeeta ....................... 216/96 |
| 5,665,527 A | 9/1997 | Allen et al. .................. 430/325 |
| 5,679,737 A | 10/1997 | DeSimone et al. .......... 524/529 |
| 5,707,783 A | 1/1998 | Stauffer et al. .............. 430/313 |
| 5,798,965 A | * 8/1998 | Jun ............................. 365/150 |
| 5,811,357 A | 9/1998 | Armacost et al. ........... 438/723 |

(List continued on next page.)

FOREIGN PATENT DOCUMENTS

JP  08062843 A  * 3/1996

OTHER PUBLICATIONS

Gallagher–Wetmore, "Supercritical Fluid Processing: A New Dry Technique for Photoresist Developing", SPIE, vol. 2438, Jun. 1995, pp. 694–708.*

Knickelbein, et al., "New Devices for the Production of Intense Pulsed Jets of $CF_2$: Laser Spectroscopic Characterization", Mat. Res. Soc. Symp. Proc., 1985, pp. 23–33, vol. 38.

Kwan, et al., "Pyrolytic CVD of Poly(organosiloxane) Thin Films", Chem. Vap. Deposition, 1997, pp. 299–301, vol. 3, No. 6.

Limb, et al., "Growth of fluorocarbon polymer thin films with high $CF_2$ fractions and low dangling bond concentrations by thermal chemical vapor deposition", Appl. Phys. Lett., 1996, pp. 2810–2812, vol. 68, No. 20.

*Primary Examiner*—Kathleen Duda
(74) *Attorney, Agent, or Firm*—Townsend and Townsend and Crew LLP

(57) ABSTRACT

Processes for patterning radiation sensitive layers are disclosed. In one embodiment, the process includes depositing a radiation sensitive material on a substrate by chemical vapor deposition. The radiation sensitive material is exposed to radiation to form a pattern and the pattern is developed using a supercritical fluid (SCF).

23 Claims, 2 Drawing Sheets

U.S. PATENT DOCUMENTS

| | | | |
|---|---|---|---|
| 5,849,809 A | 12/1998 | Narang et al. | 522/35 |
| 5,888,591 A | 3/1999 | Gleason et al. | 427/522 |
| 5,910,660 A | 6/1999 | Hodel et al. | 250/559.2 |
| 5,937,318 A | 8/1999 | Warner, Jr. et al. | 438/505 |
| 5,977,041 A | 11/1999 | Honda | 510/175 |
| 6,013,411 A | 1/2000 | Aoai et al. | 430/270.1 |
| 6,014,422 A | 1/2000 | Boyd et al. | 378/34 |
| 6,020,410 A | 2/2000 | Hacker et al. | 524/267 |
| 6,149,828 A | 11/2000 | Vaarstra | 216/57 |

\* cited by examiner

Before $CO_2$ Development

C.HFPO.HF.7
Dose = 9,200 µC/cm

After $CO_2$ Development

C.HFPO.HF.7
Dose = 10,000 µC/cm$^2$

SOLVENTLESS, RESISTLESS DIRECT DIELECTRIC PATTERNING

STATEMENT AS TO RIGHTS TO INVENTIONS MADE UNDER FEDERALLY SPONSORED RESEARCH AND DEVELOPMENT

This invention was made in the course of research sponsored in part by the National Science Foundation. The U.S. Government may have certain rights in this invention.

FIELD OF THE INVENTION

This invention relates to methods of lithographic patterning using solvent-free compositions. The invention also relates to direct patterning without resists.

BACKGROUND OF THE INVENTION

Current lithographic processes employed by the microelectronics industry have significant environmental, safety and health (ESH) impacts. The fabrication of semiconductor devices uses photoresist to lithographically define features at every mask level. Advanced complementary metal oxide semiconductor (CMOS) and bipolar integrated circuit (IC) processes can require in excess of twenty-five mask levels. This large number of processing steps results in significant volumes of chemicals being consumed. Wet solutions are used for the application of the photoresist layer and during the development step. Thus, improved resist processing presents a clear need and an opportunity to reduce the ESH impact of microelectronics manufacturing. The present invention fulfills this and other needs.

SUMMARY OF THE INVENTION

One embodiment of the present invention relates to a process for lithographically patterning a material on a substrate comprising the steps of:

(a) depositing a radiation sensitive material on the substrate by chemical vapor deposition;

(b) selectively exposing the radiation sensitive material to radiation to form a pattern; and (c) developing the pattern using a supercritical fluid (SCF) as a developer.

Another embodiment of the present invention relates to microstructures formed by the foregoing process.

Another embodiment of the present invention relates to a process for lithographically patterning a material on a substrate wherein after steps (a) and (b) above, the pattern is developed using a dry plasma etch.

Another embodiment of the present invention relates to a microelectronic structure comprising a substrate; and a patterned dielectric layer, wherein the patterned dielectric layer comprises at least one two-dimensional feature having a dimensional tolerance more precise than 7% of dimension of the two-dimensional feature.

These and other embodiments of the invention are discussed in further detail below.

BRIEF DESCRIPTION OF THE DRAWINGS

FIGS. 1(a) to 1(f) shows steps in a photoresist patterning process.

FIG. 3(a) shows a pattern before development with supercritical $CO_2$ and FIG. 3(b) shows a pattern after development with supercritical $CO_2$.

DESCRIPTION OF THE SPECIFIC EMBODIMENTS

Figures 1, 2:
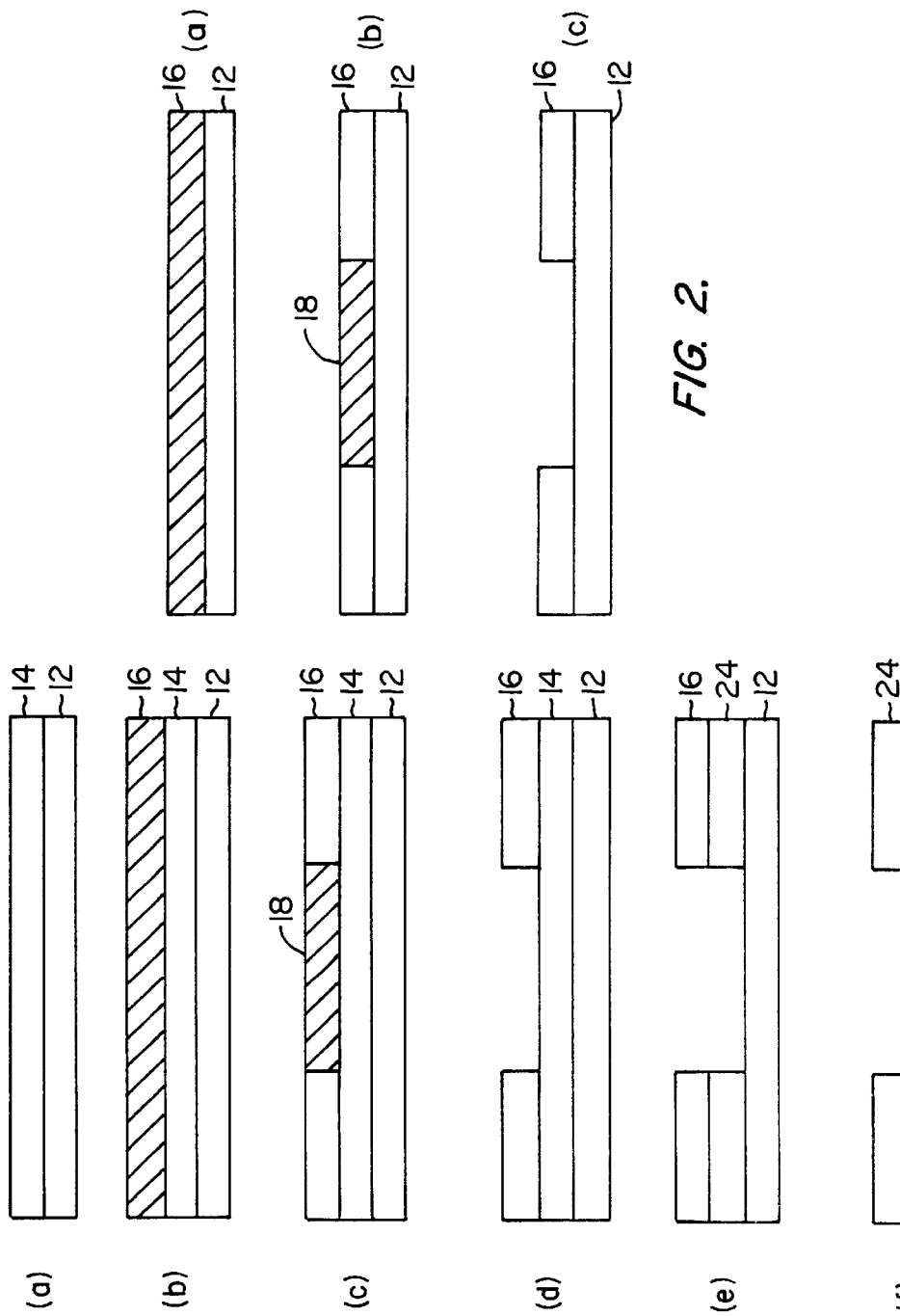
In FIG. 1, when a solvent-based spin-on photoresist is used in the deposition step shown in FIG. 1(b), the process illustrated is conventional.
FIG. 2 shows the claimed process.
Figure 3A:
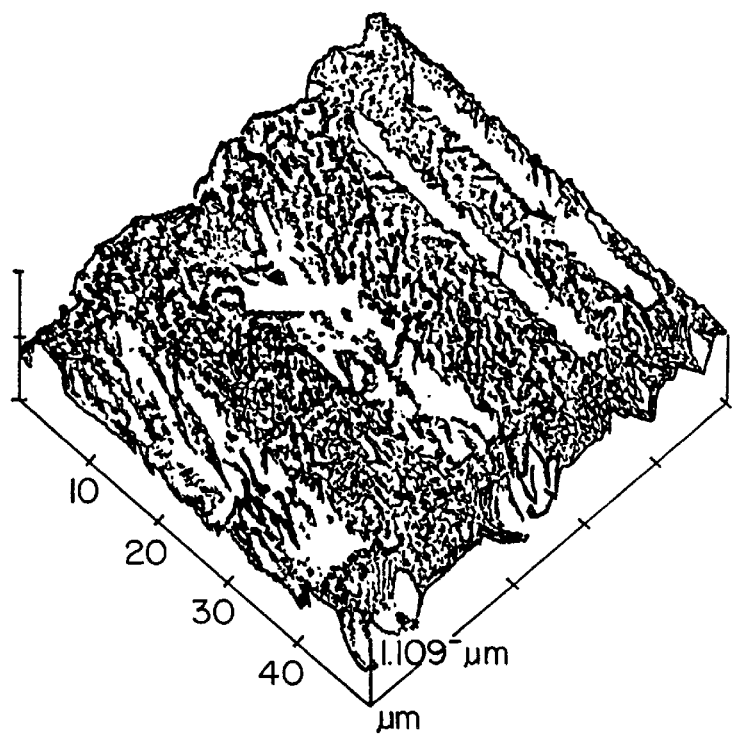
FIGS. 3(a) and 3(b) show atomic force micrographs of electron-beam patterned fluorocarbon films.
Figure 3B:
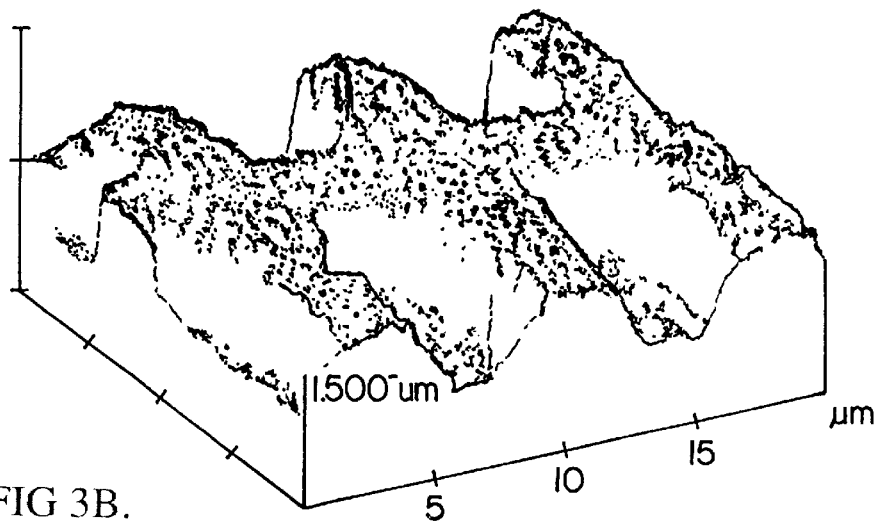

Conventional photoresists are often applied by spin-on technology. Typically, only a few percent of the material that is dispensed onto the silicon wafer actually becomes the photoresist layer and the rest becomes waste. Campbell, S. A., *The Science and Engineering of Microelectronic Fabrication.* 1996: Oxford University Press. The waste solution typically contains polymeric matrix material, photosensitive agents and solvents. Thus, spin-on resists result in large volumes of waste material, which require safe and costly disposal. The resist solutions are usually combustible, so the materials are held at temperatures below their flash point. Wolf, S. and R. N. Tauber, *Silicon Processing for the VLSI Era: Volume 1-Process Technology.* 1986: Lattice Press. Also, spin-on processes pose potential risks for worker exposure to solvents. Regulatory constraints on volatile organic chemical (VOC) emissions have motivated efforts to design revolutionary processes. Nalamasu, O., T. I. Wallow, F. M. Houlihan, E. Reichmanis, A. G. Timko, G. Dabbagh, R. A. Cirelli, R. S. Hutton, and N. E. November, Recent Progress in Resist Materials for 193 nm Lithography, Future Fab International, 1997. 1(2): p. 159. Thus, the use of vapor deposition processes and the use of supercritical carbon dioxide (SCF $CO_2$) as a developer may provide critical alternatives to the present solvent-based approaches.

After optical exposure, the pattern in a photoresist layer must be developed. As critical feature size diminishes, the selectivity and environmental friendliness of the solvent used as the developer becomes increasingly important. Suitable alternative solvents with very high selectivity and adjustable solvating power are therefore required. The application of liquid developers in the mainstream production environment generates enormous waste streams causing great environmental concern. These properties are not adequately addressed by the aqueous based solutions currently in use. There are potential opportunities for using fluids such as SCF $CO_2$, not only for environmental reasons, but also because simple adjustment of pressure and/or temperature can provide a means of optimizing solvent behavior.

Environmental and economic driving forces also favor reducing the number of processing steps required for IC production. This could be achieved by combining the functionality of photosensitive and low dielectric constant thin films. Fluoropolymers and organosilicon films (both types of polymers being soluble in SCF) $CO_2$) have low dielectric constants and good thermal stability, desirable characteristics for future interconnect insulating materials. If the patterned photoresist layer can be imaged and also satisfy the requirements for low dielectric constant interlevel dielectric materials, a great number of processing steps would be eliminated.

The first step in the present process for lithographically patterning a material on a substrate involves depositing a radiation sensitive material on the substrate by chemical vapor deposition (CVD). Thus no organic solvent is used during resist deposition. CVD includes pulsed plasma enhanced chemical vapor deposition (PECVD) and pyrolytic CVD as well as continuous PECVD.

Plasma polymerization is a common method for depositing fluorocarbon and organosilicon thin films. Campbell, S.

A., *The Science and Engineering of Microelectronic Fabrication*. 1996: Oxford University Press. Wolf, S. and R. N. Tauber, *Silicon Processing for the VLSI Era: Volume 1-Process Technology*. 1986: Lattice Press. The fluorocarbon polymers and organosilicon films may be present in the radiation sensitive materials used in embodiments of the present invention. PECVD uses continuous radio frequency (rf) power to excite the precursor gases in order to deposit films within the glow discharge region. The resulting plasma contains ions, radicals, excited species and neutrals from which solid coatings are deposited.

With pulsed PECVD and pyrolytic CVD methods, the as-deposited films are anticipated to have fewer crosslinking sites than their continuous PECVD counterparts. Thus, irradiation resulting in the production of cross-linking groups can result in dramatic differences in chemical structure. Increasing structural differences between the as-deposited and irradiated films should correlate to higher photolithographic contrast. In addition, growth rates for the pyrolytic processes are very high, which is a desirable feature for commercialization.

Pulsed PECVD limits the duration of plasma excitation and thus affords a degree of control over the reaction pathways available to the feed gas. The concentrations of species under these dynamic conditions can be very different than those achieved at steady state. In addition, plasma damage of the growing films by ion bombardment and UV irradiation is reduced. Reasonable film growth rates can be maintained because deposition continues after the plasma is extinguished.

Pyrolytic CVD of fluorocarbon has previously been reported. Limb, S. J., C. B. Labelle, K. K. Gleason, D. J. Edell, and E. F. Gleason, Growth of fluorocarbon polymer thin films with high CF2 fractions and low dangling bond concentrations by thermal CVD. Appl. Phys. Lett., 1996. 68: p. 2810. In this process, decomposition of the feed gas occurs over a hot filament or plate in vacuum, while the growth substrate is maintained around room temperature. The pyrolytic process, involves a different, and presumably less complex, reaction network than a plasma process.

As used herein, the phrase "radiation sensitive material" refers to any polymer, or other film-forming material that becomes a resist or any composition that can be induced to etch, vaporize or ion implant to form a pattern. The term "radiation" includes thermal radiation as well as photonic radiation, including radiation from particle beam sources (such as electron beam, ion beam) as well as other types of electromagnetic radiation.

In one embodiment, the radiation sensitive material of the present invention have low dielectric constants, typically less than 3.0. In one embodiment, the dielectric constant ranges from 1.9 to 2.7.

In one embodiment, the radiation-sensitive material of this invention is a fluorocarbon polymer. In one embodiment, the fluorocarbon polymer of this invention is poly($CF_2$) which is made by the polymerization of the reactive diradical difluorocarbene (:$CF_2$) (5). Hexafluoropropylene oxide (HFPO) is used as a thermal source of the radical difluorocarbene (:$CF_2$) (5). While not wishing to be bound by theory, it is believed that the unimolecular pyrolytic decomposition of HFPO proceeds according to the following scheme:

Scheme 1

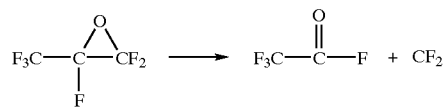

ESH impact of a CVD process can be minimized through the design of the deposition chemistry. This design involves several steps. The first is selection of CVD precursor gases which are as benign as possible. In addition, known primary reaction pathways of these precursors should not result in hazardous effluents. Next, reactor conditions can be found which efficiently react gas to form film. These steps minimize material and energy utilization as well as effluent gas production.

In one embodiment, the radiation sensitive material is an organosilicon film. The production of organosilicon films by pyrolytic CVD has been previously reported. Kwan, M. C. and K. K. Gleason, Pyrolytic CVD of poly(organosiloxane) Thin Films. Adv. Maters.: Chem. Vap. Deposition, 1997. 3(6): p. 299. Growth rates of this type of film deposition are high (well over 3,000 Å/min). High deposition rates increase throughput and reduce cost. Fast growth rates also minimize chemical consumption and effluent.

The organosilicon films used in embodiments of the present invention include organosilanes and organosiloxanes. Examples of organosilanes include without limitation tetraethylorthosilicate, diethylsilane, tetramethylsilane and trieyoxysilane. In one preferred embodiment, the organosilicon film used as the radiation-sensitive material is derived from hecxamethylcyclotrisiloxane, octamethylcyclotetrasiloxane or a mixture thereof Polyorganosiloxanes can also be deposited by pyrolytic CVD. Methods of forming a silicon oxide film on a heated substrate by chemical vapor deposition (CVD) using an organosilicon compound gas and oxygen gas are disclosed in U.S. Pat. No. 5,593,741. The use of vapor deposited organosilicon compounds as a dry resist is described in U.S. Pat. No. 5,439,780. The fluoropolymers and organosilicon films of the present invention allow for direct dielectric patterning.

In one embodiment, a photoacid generator is included in the first step of the present process, namely the depositing of radiation sensitive material on the substrate by CVD. Upon exposure to radiation, the photoacid generator generates an acid. Suitable acid generators include triflates (e.g., triphenylsulfonium triflate or bis-(t-butyl phenyl) iodonium triflate), pyrogallol (e.g., trimesylate of pyrogallol), onium salts such as triarylsulfonium and diaryl iodonium hexafluorantimonates, hexafluoroarsenates, trifluoromethane sulfonates, perfluoro alkyl sulfonium iodonium salts, and others; trifluoromethanesulfonate esters of hydroxyimides, alpha-alpha'-bis-sulfonyl diazomethanes, sulfonate esters of nitro-substituted benzyl alcohols and napthoquinone-4-diazides and alkyl disulfones. Other suitable photoacid generators are disclosed U.S. Pat. No. 4,491,628 and 5,071,730.

The second step of the process involves exposing the radiation sensitive material to radiation to form a pattern. The radiation used to irradiate the radiation sensitive material includes ultraviolet radiation, deep ultraviolet radiation, extreme-ultraviolet radiation (soft x-rays), the radiation corresponding to the gap between soft x-rays and deep ultraviolet radiation, x-rays, electron beam, and ion beam radiation. In one embodiment, the wavelength of the deep uv radiation ranges from 120 nm to 450 nm, and in one embodiment 157 nm, in one embodiment 193 nm, and in embodiment 246 nm.

The third step involves developing the pattern using a supercritical fluid (SCF) as a developer. A SCF is defined as any fluid at a temperature that is greater than its critical temperature and at a pressure that is greater than its critical pressure. Photolithography processes using aqueous based developers have been used in the electronics industry. Any developer that replaces aqueous based developers desirably produces better quality images than images produced by the aqueous based developers. Using current processes, there has been remarkable progress in the miniaturization of electronic devices over the last 2–3 decades. The trend in the electronics industry toward miniaturization and increased complexity of the IC's demands tremendous improvement both in the chemistry of the resists as well as in their processing. This has put tremendous pressure on resist design and developer usage. As target dimensions continue to decrease, the selectivity of the developer becomes increasingly important in achieving high-resolution features. Solvents with such selectivity include supercritical fluids (SCF), unusual solvents with many characteristics not found in conventional liquids. The unique properties of these fluids include liquid-like densities, gas-like diffusivities and viscosities, negligible surface tension and pressure adjustable solvating power. McHugh, M. A. and Krukonis, V. J., *Supercritical Fluid Extraction: Principles and Practice*, 2nd ed., Butterworth-Heinermann, Stoneham, Mass. 1994. Suitable examples of supercritical fluids include carbon dioxide; mixtures of carbon dioxide with at least one of butane, pentane, toluene, cyclohexane, acetonitrile, and methanol; 2,3-dimethylbutane; ethanol; n-hexane; propane; propane/water mixtures; sulfur hexafluoride; propane; and ethane. In one preferable embodiment, the supercritical fluid is supercritical carbon dioxide (SCF $CO_2$). Carbon dioxide is nontoxic, nonflammable, and inexpensive. Using SCF $CO_2$ as a developer eliminates much waste compared to traditional processes using aqueous base developers.

Along with being an extremely selective solvent, it is considered to be an "environmentally responsible" solvent both because it is not ozone depleting and due in part to its ability to be recycled by simple compression-decompression steps. Presently, millions of gallons of wastewater from semiconductor processing facilities are treated annually. Supercritical solvents offer the possibility of superior developer performance and simpler disposal or recycling with less effort and expenditure of energy than current solvents.

In one embodiment of the present invention, the step of developing the pattern is performed using a dry plasma etch, instead of SCF $CO_2$. The basic technique of plasma etching will be well known to those skilled in the art. A glow discharge is used to produced chemically reactive species (atoms, radicals and ions) from a relatively inert molecular gas. The etching gas is selected so as to generate species which react chemically with the material to be etched, and whose reaction product with the etched material is volatile.

The substrates for the present process include patternable substrate such as ceramic materials (such as glass), epoxy materials, plastic materials, semiconductor materials (such as silicon on semiconductor), silicon wafers, magnetic discs, and printed circuit boards.

The present process embodiments for lithographic patterning encompass both direct dielectric patterning as well as patterning with a resist. The direct dielectric patterning process is a resistless process wherein the patterned layer is used as an imagable dielectric in which the patterned layer remains as part of the device rather than being a sacrificial resist layer which is stripped away. In a conventional patterning process that uses the patterned layer as a resist, a photoresist pattern is exposed to a pattern of radiation and is developed using a wet chemical solution. The pattern in the patterned resist layer is transferred to an underlying layer by etching and then stripping away the resist. However, in embodiments of the invention, a supercritical fluid is used to develop the photoresist pattern instead of a conventional wet chemical solution. Thus, in a dielectric patterning process that uses a resist, the substrate comprises an underlying dielectric layer and a sacrificial resist layer on top of the underlying dielectric layer.

FIGS. 1(*a*) to 1(*f*) illustrate a dielectric patterning process using a resist pattern. As shown in FIG. 1(*a*), a dielectric layer 14 is on a substrate 12. Referring to FIG. 1(*b*), a patternable photoresist layer 16 is then deposited on the dielectric layer 14. Then, as shown in FIG. 1(*c*), a portion 18 of the photoresist layer 16 can be selectively exposed to, for example, radiation that has a wavelength of about 1.57 nm or an e-beam. Then, as shown in FIG. 1(*d*), the photoresist layer 16 can be developed and patterned using supercritical $CO_2$ to remove the exposed portion 18 of the photoresist layer 16. After developing, as shown in FIG. 1(*e*), the uncovered portion of the dielectric layer 14 is etched to form a dielectric pattern 24. Referring to FIG. 1(*f*), the photoresist layer 16 is stripped leaving a dielectric pattern 24 on the substrate 12.

FIGS. 2(*a*) to 2(*c*) show steps in a direct patterning process according to an embodiment of the invention. As shown in FIG. 2(*a*), a patternable, photosensitive dielectric layer 16 is deposited on a substrate 12. After this, as shown in FIG. 2(*b*), a portion 18 of the patternable, photosensitive dielectric layer 16 is exposed to, for example, radiation that has a wavelength of about 157 nm or an e-beam. Referring to FIG. 2(*c*), after exposing the patternable photosensitive dielectric layer 16, it is developed using supercritical $CO_2$ to leave a dielectric pattern on the substrate 12. The direct dielectric patterning process advantageously reduces the number of processing steps by using a photosensitive dielectric.

The direct patterning process is simple, environmentally friendly as wet chemistry processing can be eliminated, and is less expensive than a process using a sacrificial resist layer, because the number of processing steps is reduced. In both the dielectric pattering process using a resist (e.g., FIGS. 1(*a*) to 1(*e*)) and also the direct dielectric patterning process (e.g., FIGS. 2(*a*) to 2(*c*)), conventional wet chemistry processing can be eliminated in the dielectric deposition step, the patternable layer deposition step, and the step of developing the patternable layer.

The direct dielectric patterning process is preferred to a process that does not use direct dielectric patterning. As evident from a comparison of the processes in FIGS. 1 and 2, the direct patterning process uses fewer processing steps. Increasing the number of processing steps in a patterning process increases the likelihood of introducing distortions in the formed pattern. As such, when patterns are produced by dielectric patterning processes, the line geometries, resolution, dimensional tolerance, and/or the aspect ratio (height/width) of the patterns formed are superior to those provided by processes that do not utilize direct dielectric patterning.

"Dimensional tolerance" here refers to the dimensional precision in production of the microstructure. Thus, for example, a 180 nm structure having a dimensional tolerance of plus or minus 14 nm would have a dimensional tolerance in percent of (±14/180) times 100 or ±7.78% of the featured dimension. A "more precise" dimensional tolerance (higher precision) indicates a lower percentage number, i.e., lower than 7.78% of the featured dimension. While not wishing to be bound by theory, it is believed that the better dimensional tolerance and higher aspect ratio of the two dimensional features produced by the direct dielectric patterning process of the present invention over conventional process is due to the lower surface tension of SCF $CO_2$ which does not allow the microstructures to collapse and topple as readily as microstructures produced by the conventional process (which is not a direct dielectric process, but where images are transferred through a sacrificial resist layer as disclosed above). With regard to aspect ratios, it is believed that the conventional process can yield microstructures with a maximum aspect ratio of (4–5):1. However with direct dielectric patterning one can obtain microstructures with improved aspect ratios, preferably greater than 5:1 ratios. Furthermore, when scaling a technology, it becomes increasingly difficult to sustain a constant aspect ratio for dimensional tolerance as nanoscale structures become increasingly more fragile and more vulnerable to fluid forces and dynamics.

In one embodiment, the microelectronic structure comprises conductive features. For example, conductive features such as transistors and metal lines may be formed by metallic deposition within the dielectric pattern as part of a process for forming transistors on the substrate.

As can be seen from FIG. 1, on the left the conventional process employs a sacrificial photosensitive resist layer to pattern the dielectric layer. On the right, the number of steps is drastically reduced by use of a photosensitive dielectric. Such process simplicity is favored by both environmental and economic factors. The arrows on the right indicate steps in which the CVD and SCF $CO_2$ can replace solution based processes (wet chemistry).

Embodiments of the present invention also provide for a three-dimensional structure formed on a substrate. The three-dimensional structure is formed by a three-dimensional direct patterning process. Current lithographic processes, such as two photon patterning and holographic imaging enable the transfer of complex three dimensional structures into a resist film. However, this ability to form a three dimensional structure in the resist is lost when the image is transferred into the etched substrate, as only a two dimensional image is transferred during the etching process. However, embodiments of the present invention provide for the imaging of a three dimensional structure on the substrate, as it is not limited to a secondary transfer of an image or structure through a resist layer which only allows two-dimensional imaging. Thus, the direct patterning process according to embodiments of the present invention allows for the formation of a three-dimensional structure on a substrate.

As mentioned above, a three dimensional imaging technique can be use to selectively expose a radiation sensitive dielectric material to radiation. Examples of such imaging technique include multi-photon patterning and holographic imaging.

The production of three-dimensional sensible objects by multi-photon patterning is disclosed in U.S. Pat. No. 4,288,861. By "multiphoton", it is meant to refer to the coincidence or intersection of at least two beams of electromagnetic radiation at a target location in a molecule with sufficient incident energy to effect a selected change of energy level within the molecule as by photon absorption.

The use of holographic imaging in lithographic processes is well known to those or ordinary skill in the art. Methods for defining three-dimensional structure of an object using holographic imaging are disclosed in U.S. Pat. Nos. 5,937,318; 5,910,660 and 5,640,255.

FIGS. 2A and 2B show atomic force micrograph of electron-beam (e-beam) patterned fluorocarbon films. FIG. 2A shows the pattern produced by e-beam radiation before development with SCF $CO_2$. The figure shows densification or volatilization. FIG. 2B shows the pattern after development with SCF $CO_2$ and shows substantially removal of the material deposited by CVD (which was a fluorocarbon derived from hexafluoropropylene oxide (HFPO)) from the exposed regions.

Each of the documents referred to in this application is incorporated herein in its entirety and for all purposes by reference. Unless explicitly indicated to the contrary, all numerical quantities in this description specifying amounts of materials, number of carbon atoms, and the like, are to be understood as modified by the word "about."

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A patterning method comprising:
   (a) depositing a radiation sensitive material comprising a fluoropolymer on a substrate using chemical vapor deposition;
   (b) selectively exposing the radiation sensitive material to radiation to form a pattern; and
   (c) developing the pattern using a supercritical fluid (SCF) as a developer to form a developed pattern, wherein the developed pattern has a dielectric constant of about 3.0 or less, and wherein the developed pattern is a patterned dielectric layer that is directly patterned without using a photoresist.

2. The patterning method of claim 1 wherein the supercritical fluid is supercritical carbon dioxide.

3. The patterning method of claim 1 wherein the developed pattern has an aspect ratio of about 4:1 or more.

4. The patterning method of claim 1 wherein the method further comprises:
   (d) forming a conductive feature within the patterned dielectric layer.

5. A patterning method comprising:
   (a) depositing a radiation sensitive material on a substrate using a vapor deposition process;
   (b) selectively exposing the radiation sensitive material to radiation to form pattern; and
   (c) developing the pattern using a supercritical fluid (SCF) as a developer to form a developed pattern, wherein the developed pattern is a patterned dielectric layer that is directly patterned without using a photoresist.

6. The method of claim 5 wherein the radiation sensitive material comprises a photoacid generator.

7. The method of claim 5 wherein the vapor deposition process comprises a chemical vapor deposition process.

8. The method of claim 5 wherein the patterned dielectric layer has a dielectric constant of less than about 3.0.

9. The method of claim 5 wherein the patterned dielectric layer has a dielectric constant that ranges from about 1.9 to about 2.7.

10. The method of claim 5 wherein the radiation sensitive material includes one selected from the group consisting of a fluorocarbon and an organosilicon compound.

11. The method of claim 5 wherein the radiation sensitive material comprises poly($CF_2$).

12. The method of claim 11 wherein the poly($CF_2$) is made by polymerization of difluorocarbene (:$CF_2$).

13. The method of claim 5 wherein the radiation sensitive material comprises an organosilicon compound selected from the group consisting of organosilanes and organosiloxanes.

14. The method of claim 5 wherein the radiation used to form the pattern is selected from the group consisting of deep ultraviolet radiation (DUV), extreme ultraviolet radiation ultraviolet radiation (UV), x-rays and an ion beam.

15. The method of claim 5 wherein the radiation used to form the pattern is electron beam radiation.

16. The method of claim 5 wherein the radiation has a wavelength from about 120 to about 450 nm.

17. The method of clam 5 wherein the supercritical fluid (SCF) is supercritical carbon dioxide.

18. The method of claim 5 wherein the supercritical fluid (SCF) is a mixture of carbon dioxide and at least one member selected from the group consisting of propane, butane, 2,3-dimethylbutane, pentane, toluene, n-hexane, cyclohexane, acetonitrile, methanol, and ethanol.

19. The method of claim 5 wherein the substrate is a semiconductor substrate.

20. The method of claim 5 wherein the substrate is a silicon wafer.

21. The method of claim 5 wherein the substrate comprises an epoxy material, a ceramic material, a magnetic disc, or a printed circuit board.

22. The method of claim 5 further comprising:

(d) forming a conductive feature within the patterned dielectric layer.

23. The method of claim 5 wherein the developed pattern has an aspect ratio of greater than about 4:1, and wherein the method further comprises:

(d) forming a conductive feature within the dielectric pattern.

* * * * *